(12) United States Patent
Kondou et al.

(10) Patent No.: US 10,506,705 B2
(45) Date of Patent: Dec. 10, 2019

(54) MULTILAYER TRANSMISSION LINE PLATE

(71) Applicant: Hitachi Chemical Company, LTD., Tokyo (JP)

(72) Inventors: Yuusuke Kondou, Tokyo (JP); Etsuo Mizushima, Tokyo (JP); Takao Tanigawa, Tokyo (JP); Yuki Nagai, Tokyo (JP); Tomio Fukuda, Tokyo (JP); Tetsurou Irino, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 24 days.

(21) Appl. No.: 15/542,722

(22) PCT Filed: Nov. 20, 2015

(86) PCT No.: PCT/JP2015/082732
§ 371 (c)(1),
(2) Date: Jul. 11, 2017

(87) PCT Pub. No.: WO2016/114002
PCT Pub. Date: Jul. 21, 2016

(65) Prior Publication Data
US 2018/0139837 A1    May 17, 2018

(30) Foreign Application Priority Data

Jan. 14, 2015  (JP) .................... 2015-005188
Oct. 7, 2015   (JP) .................... 2015-199360

(51) Int. Cl.
H01P 3/08      (2006.01)
H05K 1/02      (2006.01)
(Continued)

(52) U.S. Cl.
CPC ............. *H05K 1/024* (2013.01); *B32B 17/04* (2013.01); *B32B 17/10* (2013.01); *H01P 3/026* (2013.01);
(Continued)

(58) Field of Classification Search
CPC .. H01P 3/08; H01P 3/085; H01P 3/082; H01P 3/026; H05K 1/024; H05K 1/0245
(Continued)

(56) References Cited

U.S. PATENT DOCUMENTS

2014/0158406 A1    6/2014  Kato et al.

FOREIGN PATENT DOCUMENTS

CN    102291926 A    12/2011
CN    103718657 A    4/2014
(Continued)

OTHER PUBLICATIONS

JP2009-141233 machine Translation (Year: 2009).*
(Continued)

*Primary Examiner* — Stephen E. Jones
(74) *Attorney, Agent, or Firm* — Fitch, Even, Tabin & Flannery L.L.P.

(57) ABSTRACT

Provided is a multilayered transmission line plate including a pair of ground layers, a differential wiring disposed between a one-sided ground layer of the pair of ground layers and the other ground layer, an insulating layer (X) disposed between the differential wiring and the one-sided ground layer, and an insulating layer (Y) disposed between the differential wiring and the other ground layer, wherein the insulating layer (X) has a layer containing a resin and not containing a glass cloth; the insulating layer (X) or the insulating layer (Y) has a layer containing a glass cloth and a resin; and the thickness of the insulating layer (X) is equal to or less than the thickness of the insulating layer (Y).

7 Claims, 4 Drawing Sheets

(51) Int. Cl.
  *B32B 17/04* (2006.01)
  *B32B 17/10* (2006.01)
  *H05K 1/03* (2006.01)
  *H01P 3/02* (2006.01)
  *H01P 11/00* (2006.01)
  *H05K 3/18* (2006.01)

(52) U.S. Cl.
  CPC ............ *H01P 3/08* (2013.01); *H05K 1/0245* (2013.01); *H05K 1/0366* (2013.01); *B32B 2307/206* (2013.01); *B32B 2457/04* (2013.01); *H01P 11/003* (2013.01); *H05K 1/0248* (2013.01); *H05K 1/0298* (2013.01); *H05K 1/036* (2013.01); *H05K 1/0373* (2013.01); *H05K 3/18* (2013.01); *H05K 2201/0195* (2013.01)

(58) Field of Classification Search
  USPC ....................................................... 333/238
  See application file for complete search history.

(56) References Cited

FOREIGN PATENT DOCUMENTS

| | | |
|---|---|---|
| CN | 104182562 A | 12/2014 |
| JP | H10-120646 A | 5/1998 |
| JP | 2000-047003 A | 2/2000 |
| JP | 2001-039945 A | 2/2001 |
| JP | 2004099377 A | 4/2004 |
| JP | 2006232952 A | 9/2006 |
| JP | 2009141233 A | 6/2009 |
| JP | 2009259879 A | 11/2009 |
| JP | 2011068549 A | 4/2011 |
| WO | 2013012053 A1 | 1/2013 |

OTHER PUBLICATIONS

JP2006-232952 machine translation (Year: 2006).*
International Search Report for PCT/JP2015/082732 dated Feb. 16, 2016; English translation submitted herewith (6 pages).

* cited by examiner

Background

Background

Background

MULTILAYER TRANSMISSION LINE PLATE

CROSS-REFERENCE TO RELATED APPLICATIONS

This application is a U.S. national phase application filed under 35 U.S.C. § 371 of International Application PCT/JP2015/082732, filed on Nov. 20, 2015, designating the United States, which claims benefit of the filing dates of JP 2015-005188, filed Jan. 14, 2015 and JP 2015-199360, filed Oct. 7, 2015, the contents of each of which is hereby incorporated herein by reference in its entirety.

TECHNICAL FIELD

The present invention relates to a multilayered transmission line plate, and in more detail, the present invention relates to a multilayered transmission line plate to be used for high-speed digital transmission by a Gbps-order differential transmission system.

BACKGROUND ART

Following an increase in speed of signal, the differential transmission system is widely adopted. Although the differential transmission system is advantageous for noise reduction, as the signal becomes faster, signal degradation to be caused due to generation of a common-mode noise has become problematic.

Now, in an insulating layer of the multilayered transmission line plate, in order to secure handling properties of materials at the time of manufacture of multilayered transmission line plate, mechanical properties of the multilayered transmission line plate itself, and so on, a composite material of a glass cloth and a resin is widely used.

As shown in FIG. 1, the glass cloth 101 has a structure in which glass fibers (warp) 102 and glass fibers (weft) 103 are woven vertically and horizontally, respectively, and therefore, the glass fibers overlap in a weave texture portion. Accordingly, in the composite material of a glass cloth and a resin, the abundance ratio of glass becomes high in the weave texture portion of glass fibers. Conversely, the abundance ratio of glass becomes low in a portion where the glass fibers do not overlap. In general, since the resin and the glass are different from each other in a dielectric constant, when the abundance ratio between the resin and the glass within the composite material plane is heterogeneous, the dielectric constant within the composite material plane becomes heterogeneous, too.

As shown in FIG. 2, in a multilayered transmission line plate in which a differential wiring 206 is formed between ground layers 210, 205, there is caused a case where a wiring is present in a portion 202 where the abundance ratio of glass 204 is high and a portion 203 where the abundance ratio of glass 204 is low. However, since the signal speed is different in the respective places, a deviation (skew) in arrival time of signal is generated at the receiving side, resulting in lowering of signal quality.

As a skew countermeasure, a measure by a design technology, such as oblique disposition of a wiring pattern against the weaving direction of glass, etc., is taken. However, according to this method, imposition of the wiring pattern becomes inefficient, resulting in a material loss. Thus, another solution means is required.

PTL 1 discloses a method of concentratedly adding fillers with a high dielectric constant in portions of a glass cloth that are not a weave texture, thereby making the dielectric constant within the composite material plane homogeneous.

CITATION LIST

Patent Literature

PTL 1: JP 2009-259879 A

SUMMARY OF INVENTION

Technical Problem

However, according to the method of PTL 1, since a production process of material becomes complicated, there was a case where in addition to an increase of the material costs, control of the material quality becomes difficult.

Then, a problem of the present invention is to provide a multilayered transmission line plate which makes it possible to reduce a skew in the differential transmission without adopting a complicated process and which is excellent in handling properties.

Solution to Problem

In order to solve the aforementioned problem, the present inventors made extensive and intensive investigations. As the result, it has been found that the foregoing problem can be solved by the present invention as mentioned below. Specifically, the present invention provides the following [1] to [6].

[1] A multilayered transmission line plate including a pair of ground layers, a differential wiring disposed between a one-sided ground layer of the pair of ground layers and the other ground layer, an insulating layer (X) disposed between the differential wiring and the one-sided ground layer, and an insulating layer (Y) disposed between the differential wiring and the other ground layer, wherein the insulating layer (X) has a layer containing a resin and not containing a glass cloth; the insulating layer (X) or the insulating layer (Y) has a layer containing a glass cloth and a resin; and the thickness of the insulating layer (X) is equal to or less than the thickness of the insulating layer (Y).

[2] The multilayered transmission line plate as set forth above in [1], including a pair of ground layers, a differential wiring disposed between a one-sided ground layer of the pair of ground layers and the other ground layer, an insulating layer (1-I), as the insulating layer (X), between the differential wiring and the one-sided ground layer, and an insulating layer (1-II), as the insulating layer (Y), between the differential wiring and the other ground layer, wherein the insulating layer (1-I) is a layer containing a resin and not containing a glass cloth; the insulating layer (1-II) is a layer containing a glass cloth and a resin; and the thickness of the insulating layer (1-I) is equal to or less than the thickness of the insulating layer (1-II).

[3] The multilayered transmission line plate as set forth above in [1], including a pair of ground layers, a differential wiring disposed between a one-sided ground layer of the pair of ground layers and the other ground layer, an insulating layer (2-I), as the insulating layer (Y), between the differential wiring and the one-sided ground layer, and an insulating layer (2-II), as the insulating layer (X), between the differential wiring and the other ground layer, wherein the insulating layer (2-II) has an insulating layer (2-IIA) and an insulating layer (2-IIB) laminated on the insulating layer (2-IIA); the insulating layer (2-I) is a layer containing a glass cloth and a resin; the insulating layer (2-IIA) is a layer containing a resin and not containing a glass cloth; the insulating layer (2-IIB) is a layer containing a glass cloth and a resin; and the thickness of the insulating layer (2-II) is equal to or less than the thickness of the insulating layer (2-I).

[4] The multilayered transmission line plate as set forth above in any of [1] to [3], wherein the layer containing a glass cloth and a resin is a layer containing a glass cloth and a resin composition, and a difference in dielectric constant between the glass cloth and the resin composition is 1.0 or less.

[5] The multilayered transmission line plate as set forth above in any of [1] to [4], wherein the dielectric constant of the glass cloth is 5.0 or less.

[6] A multilayered transmission line plate including a pair of ground layers, a differential wiring disposed between a one-sided ground layer of the pair of ground layers and the other ground layer, an insulating layer (3-I) disposed between the differential wiring and the one-sided ground layer, and an insulating layer (3-II) disposed between the differential wiring and the other ground layer, wherein the insulating layer (3-II) has an insulating layer (3-IIA) and an insulating layer (3-IIB) laminated on the insulating layer (3-IIA); the insulating layer (3-I) is a layer containing a resin and not containing a glass cloth; the insulating layer (3-IIA) is a layer containing a resin and not containing a glass cloth; and the insulating layer (3-IIB) is a layer containing a glass cloth and a resin.

Advantageous Effects of Invention

In accordance with the present invention, a multilayered transmission line plate which makes it possible to reduce a skew in the differential transmission without adopting a complicated process and which is excellent in handling properties can be provided.

DESCRIPTION OF EMBODIMENTS

Figure 1:
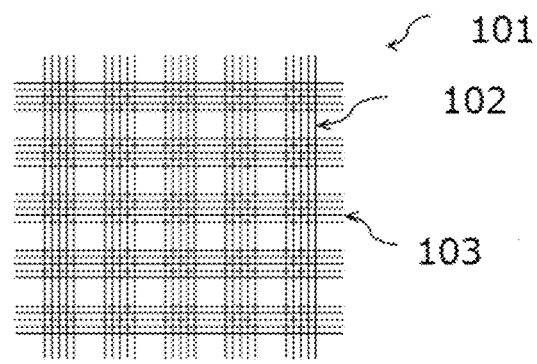
FIG. 1 is a schematic view showing weave textures of a glass cloth.
Figure 2:
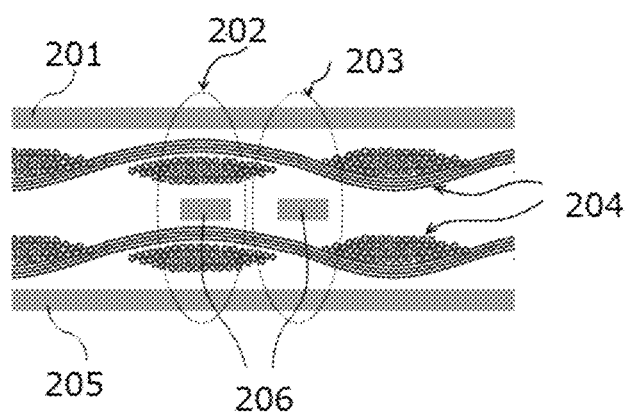
FIG. 2 is a schematic view showing a disposition example of a glass cloth and a differential wiring.

The numerical parameters set forth in the present specification and attached claims are approximations that can vary depending upon the desired properties sought to be obtained by those skilled in the art utilizing the teachings disclosed in the present specification. The recitation of numerical ranges by endpoints includes all numbers subsumed within that range (for example, 1 to 5 includes 1, 1.5, 2, 2.75, 3, 3.80, 4, and 5) and any range within that range.

Embodiments of the multilayered transmission line plate of the present invention are hereunder described in detail by reference to the accompanying drawings.

The "differential wiring" in the present disclosure also includes a conductor layer in the production process of a multilayered transmission line plate so long as it is a conductor layer having been subjected to circuit processing such that it functions as a differential wiring of the produced multilayered transmission line plate. Similarly, the "ground layer" also includes a conductor layer in the production process of a multilayered transmission line plate so long as it is a conductor layer such that it functions as a ground layer of the produced multilayered transmission line plate.

In addition, the dielectric constant in the present disclosure is a value at the time of being measured in a 10 GHz band by the cavity perturbation method (perturbation method cavity resonator: CP531, manufactured by Kanto Electronic Application and Development Inc.).

Multilayered Transmission Line Plate

The multilayered transmission line plate according to the present embodiment is, for example, used for high-speed digital transmission by a Gbps-order differential transmission system.

The multilayered transmission line plate of the present invention is a multilayered transmission line plate including a pair of ground layers, a differential wiring disposed between a one-sided ground layer of the pair of ground layers and the other ground layer, an insulating layer (X) disposed between the differential wiring and the one-sided ground layer, and an insulating layer (Y) disposed between the differential wiring and the other ground layer, wherein the insulating layer (X) has a layer containing a resin and not containing a glass cloth; the insulating layer (X) or the insulating layer (Y) has a layer containing a glass cloth and a resin; and the thickness of the insulating layer (X) is equal to or less than the thickness of the insulating layer (Y). The insulating layer (X) or the insulating layer (Y) is not limited to a single layer and may be of a structure of plural layers having plural insulating materials.

It may be considered that in view of the fact that in the multilayered transmission line plate of the present invention, a material not containing a glass cloth is used for a part of the insulating layers constituted of materials containing a glass cloth in a conventional multilayered transmission line plate, the heterogeneity of the dielectric constant is lightened, whereby the skew can be reduced.

Grand Layer

Although the grand layer is not particularly limited, materials which are applied for a conductive layer of a conventional printed wiring board or the like (for example, a metal foil, etc.) can be applied.

As the metal foil, for example, a copper foil, a nickel foil, an aluminum foil, and so on can be applied, and from the viewpoint of handling properties and costs, a copper foil is preferred. From the viewpoints of rust preventing properties, chemical resistance, and heat resistance, in the metal foil, a barrier layer made of nickel, tin, zinc, chromium, molybdenum, cobalt, etc. may also be formed. In addition, from the viewpoint of improving adhesiveness to the insulating layer, the metal foil may be subjected to a surface treatment, such as a surface roughing treatment, a treatment with a silane coupling agent, etc., etc.

The metal foil to be applied for the ground layer may also be a commercially available metal foil. Examples of the commercially available metal foil include "F2-WS" (a trade name, manufactured by Furukawa Electric Co., Ltd., Rz=2.0 μm), "FV-WS" (a trade name, manufactured by Furukawa Electric Co., Ltd., Rz=1.5 μm), and "3ECVLP" (a trade name, manufactured by Mitsui Mining and Smelting Co., Ltd., Rz=3.0 μm), all of which are a copper foil, and the like.

The ground layer may be of a single-layer structure composed of a single kind of metal material or may be of a single-layer structure composed of plural metal materials. Furthermore, the ground layer may also be of a laminated structure in which plural metal layers having a different material from each other are laminated. In addition, the thickness of the ground layer is not particularly limited.

The ground layer may be formed by means of plating. Specifically, for example, the ground layer can be formed by subjecting the surface of the insulating layer (X), the insulating layer (Y), or an adhesive resin layer provided thereon to electroless plating or electroplating.

Differential Wiring

The material that forms the differential wiring is not particularly limited, and for example, any material that can be applied for the ground layer can be used. The differential wiring may also be formed by means of plating.

Layer Containing a Resin and not Containing a Glass Cloth

The insulating layer (X) has a layer containing a resin and not containing a glass cloth.

Resin

The resin which is included in the layer containing a resin and not containing a glass cloth is not particularly limited, and a thermoplastic resin, a thermosetting resin, and so on can be used. From the viewpoint of improving dielectric properties, heat resistance, solvent resistance, and press moldability, a resin resulting from modifying a thermoplastic resin with a thermosetting resin may also be used.

Examples of the thermoplastic resin include a styrene-butadiene copolymer, polystyrene, triallyl cyanurate, triallyl isocyanurate, polybutadiene, a liquid crystal polymer (LCP) of wholly aromatic polyester, a fluorine resin, polyphenylene ether, a styrene-based elastomer, and the like. From the viewpoints of processability, adhesiveness to the metal and other resin materials, dielectric properties, and low transmission loss, polyphenylene ether may also be used.

Examples of the thermosetting resin include an epoxy resin, a bismaleimide resin, a cyanate ester resin, and the like.

As the resin resulting from modifying a thermoplastic resin with a thermosetting resin, a polyphenylene ether derivative having at least one N-substituted maleimide group in a molecule thereof [hereinafter also referred to as "polyphenylene ether derivative (A)"] is preferred. In particular, when the polyphenylene ether derivative (A) has at least one N-substituted maleimide group in a molecule thereof, it has excellent high-frequency properties (e.g., low dielectric constant, low dielectric tangent), high adhesiveness to a conductor, excellent heat resistance, high glass transition temperature, low thermal expansion coefficient, and high flame retardancy.

The polyphenylene ether derivative (A) is preferably one having at least one N-substituted maleimide structure-containing group and a structural unit represented by the following general formula (I) in a molecule thereof.

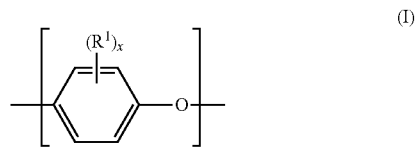

In the formula, $R^1$ each independently is an aliphatic hydrocarbon group having 1 to 5 carbon atoms or a halogen atom; and x is an integer of 0 to 4.

Examples of the aliphatic hydrocarbon group represented by $R^1$ in the general formula (I) include a methyl group, an ethyl group, a n-propyl group, an isopropyl group, a n-butyl group, an isobutyl group, a t-butyl group, a n-pentyl group, and the like. The aliphatic hydrocarbon group may be an aliphatic hydrocarbon group having 1 to 3 carbon atoms, and may also be a methyl group. In addition, examples of the halogen atom include fluorine, chlorine, bromine, iodine, and the like. The halogen atom may also be fluorine from the viewpoint that a hazardous substance is hardly generated at the time of burning.

Above all, $R^1$ may be an aliphatic hydrocarbon group having 1 to 5 carbon atoms.

x is an integer of 0 to 4, and may be an integer of 0 to 2 and may also be 2. In the case where x is 1 or 2, $R^1$ may be substituted at the ortho position (based on the substitution position of the oxygen atom) on the benzene ring. In addition, in the case where x is 2 or more, the plural Ms may be the same as or different from each other.

Specifically, the structural unit represented by the general formula (I) is preferably a structural unit represented by the following general formula (I').

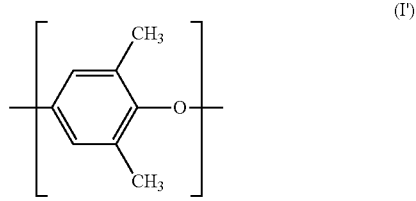

From the viewpoints of high-frequency properties, adhesiveness to a conductor, heat resistance, glass transition temperature, thermal expansion coefficient, and flame retardancy, the N-substituted maleimide structure-containing group may be a group containing a bismaleimide structure in which the nitrogen atoms of the two maleimide groups are bonded to each other via an organic group, and may also be a group represented by the following general formula (Z).

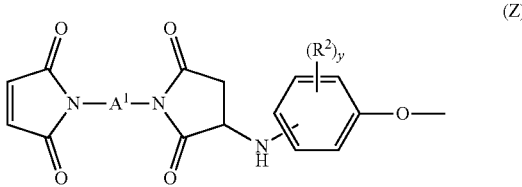

(Z)

In the formula, $R^2$ each independently is an aliphatic hydrocarbon group having 1 to 5 carbon atoms or a halogen atom; y is an integer of 0 to 4; and $A^1$ is a group represented by the following general formula (II), (III), (IV), or (V).

As for the aliphatic hydrocarbon group having 1 to 5 carbon atoms and the halogen atom, as represented by $R^2$, the same explanation as in the case of $R^1$ is applicable.

y is an integer of 0 to 4, and may be an integer of 0 to 2 and may also be 0. In the case where y is an integer of 2 or more, the plural $R^2$s may be the same as or different from each other.

The group represented by the general formula (II), (III), (IV), or (V), as represented by $A^1$, is as follows.

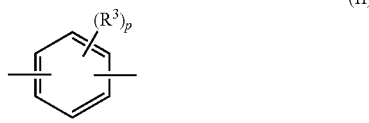

(II)

In the formula, $R^3$ each independently is an aliphatic hydrocarbon group having 1 to 5 carbon atoms or a halogen atom; and p is an integer of 0 to 4.

As for the aliphatic hydrocarbon group having 1 to 5 carbon atoms and the halogen atom, as represented by $R^3$, the same explanation as in the case of $R^1$ is applicable.

p is an integer of 0 to 4, and from the viewpoint of easiness of availability, p may be an integer of 0 to 2, and may be 0 or 1 and may also be 0. In the case where p is an integer of 2 or more, the plural $R^3$s may be the same as or different from each other.

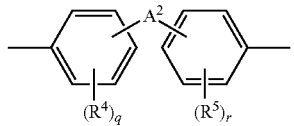

(III)

In the formula, $R^4$ and $R^5$ are each independently an aliphatic hydrocarbon group having 1 to 5 carbon atoms and a halogen atom; $A^2$ is an alkylene group having 1 to 5 carbon atoms, an alkylidene group having 2 to 5 carbon atoms, an ether group, a sulfide group, a sulfonyl group, a carbo-oxy group, a keto group, a single bond, or a group represented by the following general formula (III-1); and q and r are each independently an integer of 0 to 4.

As for the aliphatic hydrocarbon group having 1 to 5 carbon atoms and the halogen atom, as represented by $R^4$ and $R^5$, the same explanation as in the case of $R^1$ is applicable. The aliphatic hydrocarbon group may be an aliphatic hydrocarbon group having 1 to 3 carbon atoms, and may be a methyl group or an ethyl group and may also be an ethyl group.

Examples of the alkylene group having 1 to 5 carbon atoms as represented by $A^2$ include a methylene group, a 1,2-dimethylene group, a 1,3-trimethylene group, a 1,4-tetramethylene group, a 1,5-pentamethylene group, and the like. From the viewpoints of high-frequency properties, adhesiveness to a conductor, heat resistance, glass transition temperature, thermal expansion coefficient, and flame retardancy, the alkylene group may be an alkylene group having 1 to 3 carbon atoms and may also be a methylene group.

Examples of the alkylidene group having 2 to 5 carbon atoms as represented by $A^2$ include an ethylidene group, a propylidene group, an isopropylidene group, a butylidene group, an isobutylidene group, a pentylidene group, an isopentylidene group, and the like. Among them, from the viewpoints of high-frequency properties, adhesiveness to a conductor, heat resistance, glass transition temperature, thermal expansion coefficient, and flame retardancy, the alkylidene group may also be an isopropylidene group.

Among the aforementioned choices, $A^2$ may be an alkylene group having 1 to 5 carbon atoms or an alkylidene group having 2 to 5 carbon atoms.

q and r are each independently an integer of 0 to 4, and from the viewpoint of easiness of availability, all of q and r may be an integer of 0 to 2 and may also be 0 or 2. In the case where q or r is an integer of 2 or more, the plural $R^4$ or plural $R^5$ may be the same as or different from each other.

The group represented by the general formula (III-1), as represented by $A^2$, is as follows.

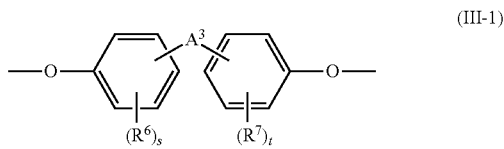

(III-1)

In the formula, $R^6$ and $R^7$ are each independently an aliphatic hydrocarbon group having 1 to 5 carbon atoms or a halogen atom; $A^3$ is an alkylene group having 1 to 5 carbon atoms, an isopropylidene group, an ether group, a sulfide group, a sulfonyl group, a carbo-oxy group, a keto group, or a single bond; and s and t are each independently an integer of 0 to 4.

As for the aliphatic hydrocarbon group having 1 to 5 carbon atoms and the halogen atom, as represented by $R^6$ and $R^7$, the same explanation as in the case of $R^4$ and $R^5$ is applicable.

Examples of the alkylene group having 1 to 5 carbon atoms as represented by $A^3$ include the same groups as in the alkylene group having 1 to 5 carbon atoms as represented by $A^2$.

Among the aforementioned choices, an alkylidene group having 2 to 5 carbon atoms may be selected as $A^3$.

s and t are each an integer of 0 to 4, and from the viewpoint of easiness of availability, all of s and t may be an integer of 0 to 2, and may be 0 or 1 and may also be 0. In the case where s or t is an integer of 2 or more, the plural $R^6$s or the plural $R^7$s may be the same as or different from each other.

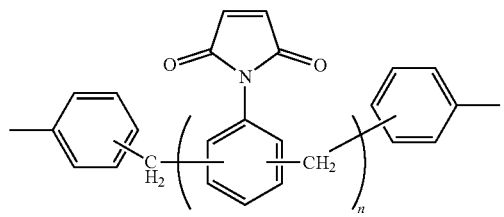

(IV)

In the formula, n is an integer of 0 to 10.

From the viewpoint of easiness of availability, n may be an integer of 0 to 5 and may also be an integer of 0 to 3.

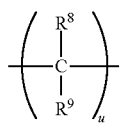

(V)

In the formula, $R^8$ and $R^9$ are each independently a hydrogen atom or an aliphatic hydrocarbon group having 1 to 5 carbon atoms; and u is an integer of 1 to 8.

As for the aliphatic hydrocarbon group having 1 to 5 carbon atoms and the halogen atom, as represented by $R^8$ and $R^9$, the same explanation as in the case of $R^1$ is applicable.

u is an integer of 1 to 8, and may be an integer of 1 to 3 and may also be 1.

From the viewpoints of high-frequency properties, adhesiveness to a conductor, heat resistance, glass transition temperature, thermal expansion coefficient, and flame retardancy, $A^1$ in the group represented by the general formula (Z) may be any of groups represented by the following formulae.

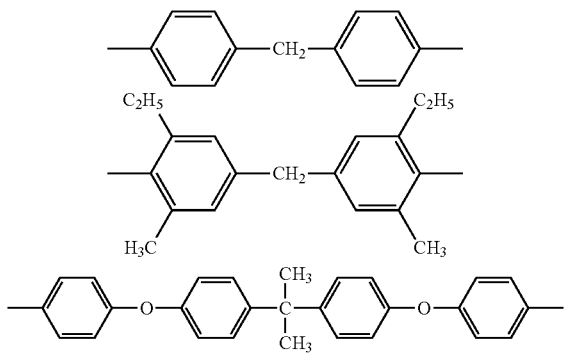

The aforementioned polyphenylene ether derivative (A) can be, for example, obtained by the following production method. The polyphenylene ether derivative (A) can be produced by first subjecting an aminophenol compound represented by the following general formula (VIII) [hereinafter also referred to as "aminophenol compound (VIII)"] and a polyphenylene ether, for example, having a number average molecular weight of 15,000 to 25,000 to a known redistribution reaction in an organic solvent, thereby producing a polyphenylene ether compound (A') having a primary amino group in a molecule thereof [hereinafter also referred to as "polyphenylene ether compound (A')"] while being accompanied with molecular weight reduction of the polyphenylene ether; and subsequently subjecting the polyphenylene ether compound (A') and a bismaleimide compound represented by the general formula (IX) [hereinafter also referred to as "bismaleimide compound (IX)"] to a Michael addition reaction.

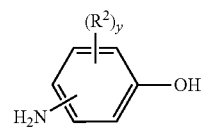

(VIII)

In the formula, $R^2$ and y are the same as those in the general formula (Z).

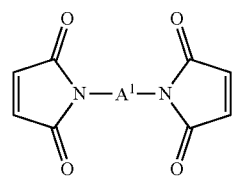

(IX)

In the formula, $A^1$ is the same as that in the general formula (Z).

Examples of the aminophenol compound (VIII) include o-aminophenol, m-aminophenol, p-aminophenol, and the like. Examples of the bismaleimide compound (IX) include bis(4-maleimidophenyl)methane, 3,3'-dimethyl-5,5'-diethyl-4,4'-diphenylmethane bismaleimide, 2,2-bis(4-(4-maleimidophenoxy)phenyl)propane, and the like.

The polyphenylene ether derivative (A) is obtained by charging predetermined amounts of the aforementioned bismaleimide compound (IX) and optionally, a reaction catalyst, etc. in a solution of the polyphenylene ether compound (A') and undergoing a Michael addition reaction while heating, keeping the temperature, and stirring. As for a reaction condition in this step, from the viewpoints of workability and gelation inhibition, for example, the reaction temperature may be in a range of 50 to 160° C., and the reaction time may be in a range of 1 to 10 hours.

Although the content of the polyphenylene ether derivative (A) in the layer containing a resin and not containing a glass cloth is not particularly limited, from the viewpoint of obtaining the insulating layer having excellent high-frequency properties (e.g., low dielectric constant, low dielectric tangent), high adhesiveness to a conductor, excellent heat resistance, high glass transition temperature, low thermal expansion coefficient, and high flame retardancy, it may be 2 to 50% by mass, and may be 5 to 40% by mass and may also be 10 to 30% by mass in the total amount of the resins which are included in the layer containing a resin and not containing a glass cloth.

As the thermosetting resin which is included in the layer containing a resin and not containing a glass cloth, a polymaleimide compound (a) having at least two N-substituted maleimide groups in a molecule thereof [hereinafter also referred to as "component (a)"] or a polyaminomaleimide compound (B) represented by the following general formula (VI) is preferred.

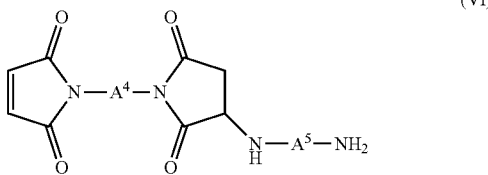

(VI)

In the formula, $A^4$ is the same as in the definition for $A^1$ in the general formula (Z); and $A^5$ is a group represented by the following general formula (VII).

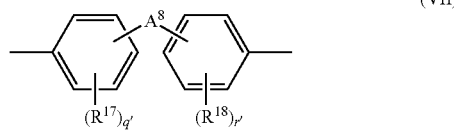

(VII)

In the formula, $R^{17}$ and $R^{18}$ are each independently an aliphatic hydrocarbon group having 1 to 5 carbon atoms, an alkoxy group having 1 to 5 carbon atoms, a hydroxyl group, or a halogen atom; $A^8$ is an alkylene group having 1 to 5 carbon atoms, an alkylidene group having 2 to 5 carbon atoms, an ether group, a sulfide group, a sulfonyl group, a carbo-oxy group, a keto group, a fluorenylene group, a single bond, or a group represented by the following general formula (VII-1) or (VII-2); and q' and r' are each independently an integer of 0 to 4.

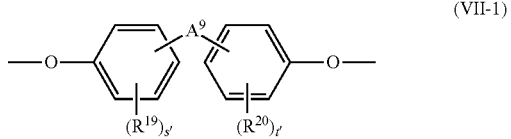

(VII-1)

In the formula, $R^{19}$ and $R^{20}$ are each independently an aliphatic hydrocarbon group having 1 to 5 carbon atoms or a halogen atom; $A^9$ is an alkylene group having 1 to 5 carbon atoms, an isopropylidene group, a m- or p-phenylenediiso-propylidene group, an ether group, a sulfide group, a sulfonyl group, a carbo-oxy group, a keto group, or a single bond; and s' and t' are each independently an integer of 0 to 4.

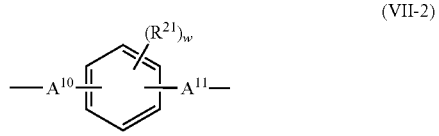

(VII-2)

In the formula, $R^{21}$ is an aliphatic hydrocarbon group having 1 to 5 carbon atoms or a halogen atom; $A^{10}$ and $A^{11}$ are each independently an alkylene group having 1 to 5 carbon atoms, an isopropylidene group, an ether group, a sulfide group, a sulfonyl group, a carbo-oxy group, a keto group, or a single bond; and w is an integer of 0 to 4.

Examples of the aliphatic hydrocarbon group having 1 to 5 carbon atoms or the halogen atom, as represented by $R^{17}$, $R^{18}$, $R^{19}$, $R^{20}$, and $R^{21}$ in the general formula (VII), (VII-1), or (VII-2), include those the same as in $R^1$ in the general formula (I). The aliphatic hydrocarbon group may be an aliphatic hydrocarbon group having 1 to 3 carbon atom and may also be a methyl group or an ethyl group.

As for the alkylene group having 1 to 5 carbon atoms and the alkylidene group having 2 to 5 carbon atoms, as represented by $A^8$ and $A^9$ in the general formula (VII) or (VII-1), and the alkylene group having 1 to 5 carbon atoms, as represented by $A^{10}$ and $A^{11}$ in the general formula (VII-2), the same explanation as in the case of $A^2$ in the general formula (III) is applicable.

q' and r' are each an integer of 0 to 4, and from the viewpoint of easiness of availability, all of q' and r' may be an integer of 0 to 2 and may also be 0 or 2. s' and t' are each an integer of 0 to 4, and from the viewpoint of easiness of availability, all of s' and t' may be an integer of 0 to 2, and may be 0 or 1 and may also be 0. w is an integer of 0 to 4, and from the viewpoint of easiness of availability, w may be an integer of 0 to 2 and may also be 0.

The component (a) is not particularly limited, and for example, the same as in the bismaleimide compound (IX) may be applied.

The polyaminobismaleimide compound (B) is, for example, obtained by subjecting the component (a) and an aromatic diamine compound (b) having two primary amino groups in a molecule thereof [hereinafter also referred to as "component (b)"] to a Michael addition reaction in an organic solvent.

Examples of the component (b) include 4,4'-diaminodiphenylmethane, 4,4'-diamino-3,3'-dimethyl-diphenylmethane, 4,4'-diamino-3,3'-diethyl-diphenylmethane, 2,2-bis(4-(4-aminophenoxy)phenyl)propane, 4,4'-[1,3-phenylenebis(1-methylethylidene)]bisaniline, 4,4'-[1,4-phenylenebis(1-methylethylidene)]bisaniline, and the like.

Although the content of the polyaminobismaleimide compound (B) in the layer containing a resin and not containing a glass cloth is not particularly limited, from the viewpoint of obtaining the insulating layer having excellent high-frequency properties (e.g., low dielectric constant, low dielectric tangent), high adhesiveness to a conductor, excellent heat resistance, high glass transition temperature, low thermal expansion coefficient, and high flame retardancy, it may be 50 to 98% by mass, and may be 60 to 95% by mass and may also be 70 to 90% by mass in the total amount of the resins which are included in the layer containing a resin and not containing a glass cloth.

From the viewpoint of obtaining the insulating layer having high adhesiveness to a conductor, excellent heat resistance, high glass transition temperature, low thermal expansion coefficient, and high flame retardancy, the resin which is included in the layer containing a resin and not containing a glass cloth is preferably one or more selected from the group consisting of the polyphenylene ether derivative (A) and the polyaminobismaleimide compound (B), and more preferably a combination of the polyphenylene ether derivative (A) and the polyaminobismaleimide compound (B).

These resins may be used alone or in combination of two or more thereof.

In addition, in the layer containing a resin and not containing a glass cloth, an inorganic filler, a flame retardant, various additives, and so on may be further blended, if desired.

<<Inorganic Filler>>

Although the inorganic filler that is included in the layer containing a resin and not containing a glass cloth, if desired is not particularly limited, examples thereof include alumina, titanium oxide, mica, silica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay, talc, aluminum borate, aluminum borate, silicon carbide, and the like. These inorganic fillers may be used alone or in combination of two or more thereof.

The shape of the inorganic filler is not particularly limited, and an inorganic filler in a spherical or crushed shape, or the like can be used.

Although the volume average particle diameter of the inorganic filler is not particularly limited, for example, it may be 0.01 to 50 µm and may also be 0.1 to 15 µm.

Although the blending proportion of the inorganic filler relative to the resin is not particularly limited, for example, it can be set to 1 to 1,000 parts by mass based on 100 parts by mass of the total amount of the resins. When the blending proportion of the inorganic filler falls within the aforementioned range, the adhesiveness, the toughness of the insulating layer, the heat resistance, the chemical resistance, and so on are more improved. Furthermore, from the viewpoint of suppressing the thermal expansion, the blending proportion of the inorganic filler can be set to 1 to 800 parts by mass and can also be set to 10 to 500 parts by mass based on 100 parts by mass of the total amount of the resins.

Although the flame retardant is not particularly limited, for example, flame retardants, such as bromine-based compounds, phosphorus-based compounds, metal oxides, etc., are usable. The flame retardant may be used alone or in combination of two or more thereof.

Although the blending proportion of the flame retardant is not particularly limited, it can be set to 10 to 200 parts by mass, and can be set to 15 to 150 parts by mass and can also be set to 20 to 100 parts by mass based on 100 parts by mass of the total amount of the resins. When the blending proportion of the flame retardant is 10 parts by mass or more, the flame resistance is more improved, and when it is 200 parts by mass or less, the heat resistance, the adhesiveness, the film forming ability, and the moldability are more improved.

Although the various additives are not particularly limited, examples thereof include a silane coupling agent, a titanate coupling agent, a heat stabilizer, an antistatic agent, a UV absorber, a pigment, a colorant, a lubricant, and the like. These additives may be used alone or in combination of two or more thereof.

Layer Containing a Glass Cloth and a Resin

The insulating layer (Y) has a layer containing a glass cloth and a resin.

The layer containing a glass cloth and a resin may be a layer containing a glass cloth and a resin composition. The resin composition which is included in the layer containing a glass cloth and a resin is not particularly limited so long as it includes a resin, and if desired, it may be further blended with other components, such as an inorganic filler, a flame retardant, various additives, etc. In the present specification, the resin which is included in the "resin composition" may be in any state of a monomer before curing, an oligomer in a semi-cured state (so-called B-stage), and a polymer after curing. In addition, in the present specification, the terms "containing a resin" include not only the case where the resin is singly contained but also the case where the resin composition is contained.

<<Glass Cloth>>

The glass cloth is not particularly limited, and so long as it is one prepared by weaving yarns in a high density or one using opened fiber yarns (opened yarns), the heterogeneity of the dielectric constant can be more reduced. In addition, when glass fiber yarns of the same kind are used for the warp and the weft, the heterogeneity of the dielectric constant can be similarly more reduced.

Examples of the glass fiber may include an E-glass, an NE-glass, a D-glass, a Q-glass, and the like. When a glass cloth in which glass fiber yarns having a dielectric constant close to the resin to be impregnated are used for the warp and the weft, or the like is used, the heterogeneity of the dielectric constant can be more reduced.

From the viewpoint of reducing the heterogeneity of the dielectric constant, the dielectric constant of the glass cloth is preferably 5.0 or less, and more preferably 4.5 or less.

As the resin or resin composition which is included in the layer containing a glass cloth and a resin, the same materials as those included in the aforementioned layer containing a resin and not containing a glass cloth can be used, and a preferred embodiment is identical, too.

From the viewpoint of low transmission loss, a difference in dielectric constant between the glass cloth and the resin composition, each of which is included in the layer containing a glass cloth and a resin, is preferably 1.0 or less, more preferably 0.5 or less, and still more preferably 0.1 or less.

In order to control the difference in dielectric constant between the glass cloth and the resin composition to 1.0 or less, the dielectric constant of the resin composition has only to be made close to the dielectric constant of the glass cloth used. For example, when the aforementioned thermoplastic resin or thermosetting resin is used as the resin, the dielectric constant can be controlled to about 2 to 4 through selection of the kind of resin, the blending ration, or the like. In the case where the dielectric constant of the glass cloth is large, so that the difference in dielectric constant is larger, when an inorganic filler, a flame retardant, or the like having a higher dielectric constant than the resin is added to this resin, the dielectric constant of the foregoing resin can be further increased. For example, in view of the fact that the dielectric constant of E-glass is about 6.8, whereas the dielectric constant of a general epoxy resin is about 3.8, when a resin composition in which 100 parts by mass of the epoxy resin and 300 parts by mass of an alumina filler having a dielectric constant of about 10 are mixed is used relative to the glass cloth of the E-glass, the difference in dielectric constant between the glass cloth and the resin composition can be controlled to 1.0 or less.

As for the layer containing a glass cloth and a resin, one obtained by heating and/or pressurizing a known prepreg alone or a laminate of plural prepregs can also be used. Examples of the known (commercially available) prepreg include "GWA-900G", "GWA-910G", "GHA-679G", "GHA-679G(S)", and "GZA-71G", all of which are manufactured by Hitachi Chemical Company, Ltd., and the like.

Production Method of Multilayered Transmission Line Plate

The multilayered transmission line plate of the present invention is obtained by using a prepreg for forming the layer containing a glass cloth and a resin and a resin film for forming the layer containing a resin and not containing a glass cloth and properly combining and laminating them in conformity with an embodiment. For example, the multilayered transmission line plate can be produced by subjecting a copper foil of one side of a laminated plate obtained by curing the prepreg having a copper foil laminated on the both surfaces thereof to circuit processing, thereby forming an insulating layer in which a differential wiring is disposed on one of the surfaces, and a ground layer is disposed on the other surface, and subsequently, laminating the foregoing resin film and the copper foil constituting the ground layer in this order on the surface on which the differential wiring has been formed, followed by molding.

Prepreg

The prepreg for forming the layer containing a glass cloth and a resin includes a glass cloth and a resin or resin composition, each of which is used for the aforementioned layer containing a glass cloth and a resin. The prepreg is, for example, obtained by a method of impregnating the aforementioned glass cloth with a resin varnish obtained by dissolving and/or dispersing the aforementioned resin or resin composition in an organic solvent.

Although the method of impregnating the glass cloth with the resin varnish is not particularly limited, examples thereof include a method of immersing the glass cloth in the resin varnish; a method of coating the resin varnish on the glass cloth by a coater of every kind; a method of blowing the resin varnish onto the glass cloth by a spray; and the like. Among them, from the viewpoint of improving the impregnation properties of the resin varnish, a method of immersing the glass cloth in the resin varnish can be adopted.

As for a drying condition after impregnating the glass cloth with the resin varnish, for example, a condition under which the content of the organic solvent in the prepreg after drying is 10% by mass or less can be adopted, and a condition under which the content of the organic solvent in the prepreg after drying is 5% by mass or less can also be adopted. For example, the prepreg can be formed by drying the varnish including 30 to 60% by mass of the organic solvent at 50 to 150° C. for about 3 to 10 minutes.

From the viewpoint of low transmission loss, a difference in dielectric constant between the glass cloth and the resin composition on the occasion of curing the prepreg is preferably 1.0 or less, more preferably 0.5 or less, and still more preferably 0.1 or less.

Although the dielectric constant on the occasion of curing the prepreg is not particularly limited, from the viewpoint of more conforming with the use in a high-frequency region, it is preferably 4.0 or less, and more preferably 3.8 or less.

The thickness of the prepreg has only to be properly determined in conformity with the thickness of the insulating layer to be formed.

Resin Film

The resin film for forming the layer containing a resin and not containing a glass cloth contains the resin or resin composition which is used for the aforementioned layer containing a resin and not containing a glass cloth. The aforementioned resin film can be obtained by a known method, and for example, it is obtained by a method in which after optionally mixing the aforementioned resin with the aforementioned other components, the resultant is subjected to layer formation on a support.

The mixing method of the resin is not particularly limited, and a known method can be adopted.

As the method of subjecting the resin to layer formation on the support, there is exemplified a method in which a resin varnish is prepared by dissolving and/or dispersing the resin in an organic solvent, and the resin varnish is coated on the support using a coater of every kind, followed by drying by means of heating, blowing of hot air, or the like.

The thus obtained resin film may be in a semi-cured (B-stage) state. The semi-cured resin film may be in a state where an adhesive force is secured when laminated and cured and also in a state where embedding properties (fluidity) into a differential wiring 91 are secured.

Although the organic solvent which is used for the resin varnish is not particularly limited, examples thereof include organic solvents, for example, alcohols, such as methanol, ethanol, butanol, etc.; ethers, such as ethyl cellosolve, butyl cellosolve, ethylene glycol monomethyl ether, carbitol, butyl carbitol, etc.; ketones, such as acetone, methyl ethyl ketone, methyl isobutyl ketone, cyclohexanone, etc.; aromatic hydrocarbons, such as toluene, xylene, mesitylene, etc.; esters, such as methoxyethyl acetate, ethoxyethyl acetate, butoxyethyl acetate, ethyl acetate, etc.; nitrogen-containing compounds, such as N,N-dimethylformamide, N,N-dimethylacetamide, N-methyl-2-pyrrolidone, etc.; and the like. These organic solvents may be used alone or in combination of two or more thereof.

Although the solid matter (non-volatile matter) concentration of the resin varnish is not particularly limited, for example, it can be set to 5 to 80% by mass.

The coater which is used on the occasion of coating the resin varnish on the support may be properly selected in conformity with the thickness of the resin film to be formed, or the like, and for example, a die coater, a comma coater, a bar coater, a kiss coater, a roll coater, and so on can be used.

As for a drying condition after coating the resin varnish on the support, for example, a condition under which the content of the organic solvent in the resin film after drying is 10% by mass or less can be adopted, and a condition under which the content of the organic solvent in the resin film after drying is 5% by mass or less can also be adopted. For example, the resin film can be formed by drying the varnish including 30 to 60% by mass of the organic solvent at 50 to 150° C. for about 3 to 10 minutes. As for the drying condition, a suitable drying condition can be properly set through a simple experiment in advance.

The thickness of the resin film may be properly determined in conformity with the thickness of the insulating layer to be formed.

Examples of the support of the resin film include films made of a polyolefin, such as polyethylene, polypropylene, polyvinyl chloride, etc.; a polyester, such as polyethylene terephthalate, polyethylene naphthalate, etc.; a polycarbonate, a polyimide, or the like; and also a release paper, a metal foil (e.g., a copper foil, an aluminum foil, etc.), and the like. The support and a protective film as mentioned later may be subjected to, in addition to a matting treatment and a corona treatment, a release treatment or the like.

The thickness of the support can be, for example, set to 10 to 150 μm and can also be set to 25 to 50 μm. A protective film can be further laminated on the surface of the resin film on which the support is not provided. The protective layer may be made of a material the same as or different from the support. The thickness of the protective film is, for example, 1 to 40 μm. By laminating the protective film, contamination by foreign substances can be prevented from occurring, and the resin film can be stored upon being wound up in a roll state.

Laminate Molding Condition

Although a molding method and a molding condition of the multilayered transmission line plate according to the present invention are not particularly limited, for example, a molding method and a molding condition of laminated plate and multilayered plate for electric insulating material can be applied. Specifically, the multilayered transmission line plate can be molded by using, for example, a multi-stage press, a multi-stage vacuum press, a continuous molding machine, an autoclave molding machine, or the like at a temperature of 100 to 250° C. and a pressure of 0.2 to 10 MPa for a heating time in the range of 0.1 to 5 hours.

The ground layer may be formed through lamination of a metal foil as mentioned above, or may be formed using a known method, such as dry plating, etc.

A via hole or a through-hole may be formed by boring the insulating layer of the resulting multilayered transmission line plate. The boring can be performed by a known method using a drill, a laser, a plasma, or the like, and if desired, can be performed through a combination of these methods.

As for the embodiment of the multilayered transmission line plate of the present invention, multilayered transmission line plates according to first to third embodiments are hereinafter cited as examples, and each of the embodiments is described by reference to the accompanying drawings.

The respective materials constituting layers included in the multilayered transmission line plates according to first to third embodiments, the embodiments of respective layers, lamination conditions, and so on are those as described above with respect to the multilayered transmission line plate of the present invention, and preferred embodiments are also the same.

Multilayered Transmission Line Plate According to the First Embodiment

Figure 3:
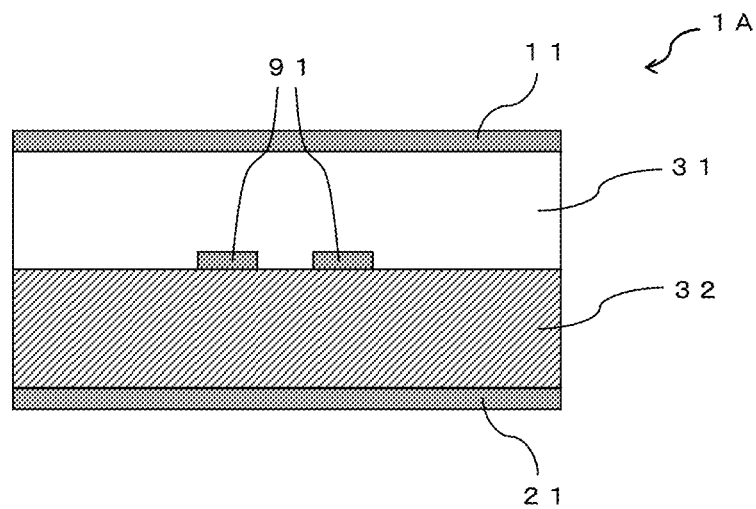
FIG. 3 is a schematic cross-sectional view showing a multilayered transmission line plate according to a first embodiment (Example 1) of the present invention.

FIG. 3 is a schematic cross-sectional view showing a multilayered transmission line plate 1A according to the first embodiment of the present invention.

As shown in FIG. 3, the multilayered transmission line plate 1A according to the first embodiment of the present invention is a multilayered transmission line plate which includes a pair of ground layers 11 and 21; a differential wiring 91 disposed between the one-sided ground layer 11 of the pair of the ground layers 11 and 21 and the other ground layer 21; an insulating layer (1-I) 31 disposed between the differential wiring 91 and the one-sided ground layer 11; and an insulating layer (1-II) 32 disposed between the differential wiring 91 and the other ground layer 21, and in which the insulating layer (1-I) 31 is a layer containing a resin and not containing a glass cloth; the insulating layer (1-II) 32 is a layer containing a glass cloth and a resin; and the thickness of the insulating layer (1-I) 31 is equal to or less than the thickness of the insulating layer (1-II) 32.

Figure 6:
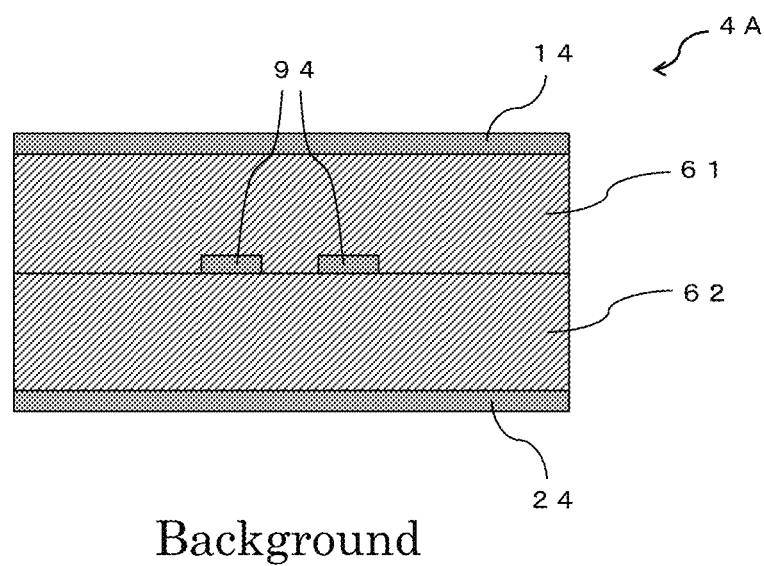
FIG. 6 is a schematic cross-sectional view showing a conventional multilayered transmission line plate.

FIG. 6 is a schematic cross-sectional view showing a conventional multilayered transmission line plate 4A. The conventional multilayered transmission line plate 4A was produced by a method in which a copper foil of one side of a laminated plate obtained by laminating a copper foil on both surfaces of a prepreg and then curing is subjected to circuit processing, thereby forming an insulating layer 62 in which a differential wiring 94 is disposed on a one-sided surface thereof, and a ground layer 24 is disposed on the other surface, and a prepreg for forming an insulating layer 61 and a copper foil constituting a ground layer 14 are further laminated in this order on the surface of the side of the differential wiring 94, followed by molding.

In the multilayered transmission line plate 1A according to the first embodiment of the present invention, by changing the insulating layer 61 in the conventional multilayered transmission line plate 4A shown in FIG. 6 to the insulating layer (1-I) 31 that is the layer containing a resin and not containing a glass cloth, it is able to contemplate to reduce the skew without impairing the handling properties.

At this time, it is important to control the thickness of the insulating layer (1-I) 31 to equal to or less than the thickness of the insulating layer (1-II) 32.

This is because at the time of signal transmission, a stronger electric field is generated on the side of a thin insulating layer, and therefore, electric properties of the insulating layer are more strongly reflected in transmission properties of signal. That is, in order to reflect the homogeneity of the dielectric constant of the insulating layer (1-I) 31 that is the layer containing a resin and not containing a glass cloth, it is important that the thickness of the insulating layer (1-I) 31 is equal to the thickness of the insulating layer (1-II) 32 that is the layer containing a glass cloth and a resin, or thinner than the thickness of the insulating layer (1-II) 32.

Although the thickness of the insulating layer (1-I) 31 is not particularly limited, it is, for example, 10 to 300 µm, and from the viewpoint of making both thinning and loss reduction compatible with each other, the thickness of the insulating layer (1-I) 31 can be set to 20 to 250 µm, and from the same viewpoint, it can also be set to 30 to 200 µm.

The thickness of the insulating layer (1-I) 31 is equal to or less than the thickness of the insulating layer (1-II) 32, and from the viewpoint of inhibiting a warp of a substrate, it can be set to less than the thickness of the insulating layer (1-II) 32.

In addition, from the same viewpoint, a difference between the thickness of the insulating layer (1-I) 31 and the thickness of the insulating layer (1-II) 32 can be set to 0 to 150 µm and can also be set to 0.01 to 100 µm.

Although the thickness of the insulating layer (1-II) 32 is not particularly limited, it is, for example, 30 to 400 µm, and from the viewpoint of making both thinning and loss reduction compatible with each other, the thickness of the insulating layer (1-II) 32 can be set to 40 to 300 µm, and from the same viewpoint, it can also be set to 50 to 200 µm.

Production Method of Multilayered Transmission Line Plate According to the First Embodiment Next, the production method of the multilayered transmission line plate 1A according to the first embodiment of the present invention is described.

The multilayered transmission line plate 1A according to the first embodiment of the present invention can be, for example, produced by a method in which a copper foil of one side of a laminated plate obtained by laminating a copper foil on both surfaces of a prepreg and then curing is subjected to circuit processing, thereby forming the insulating layer (1-II) 32 in which the differential wiring 91 is disposed on a one-sided surface thereof, and the ground layer 21 is disposed on the other surface, and subsequently, a resin film for forming the insulating layer (1-I) 31 and a copper foil constituting the ground layer 11 are laminated in this order on the surface on which the differential wiring 91 is formed, followed by molding.

In the aforementioned multilayered transmission line plate according to the first embodiment of the present invention, a configuration in which the insulating layer (1-I) 31 and the insulating layer (1-II) 32 shown in FIG. 3 are made upside down can be formed in the same manner as mentioned above and adopted.

Next, the multilayered transmission line plate according to the second embodiment of the present invention is described.

Multilayered Transmission Line Plate According to the Second Embodiment

Figure 4:
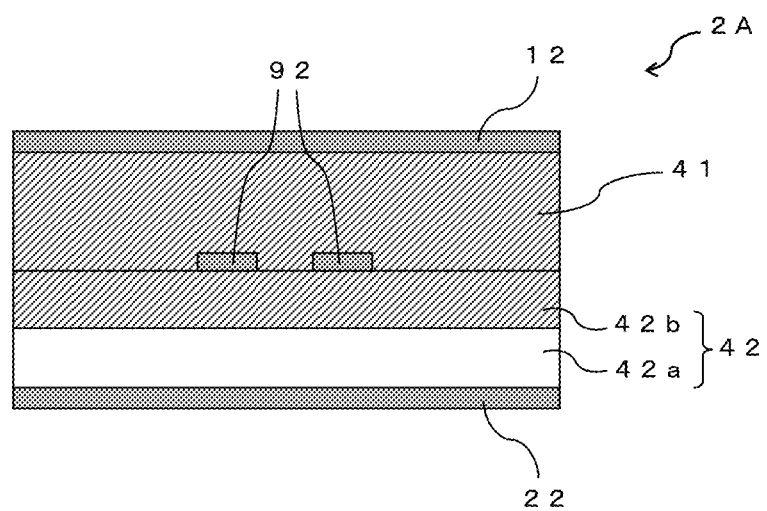
FIG. 4 is a schematic cross-sectional view showing a multilayered transmission line plate according to a second embodiment (Example 7) of the present invention.

FIG. 4 is a schematic cross-sectional view showing a multilayered transmission line plate 2A according to the second embodiment of the present invention.

As shown in FIG. 4, the multilayered transmission line plate 2A according to the second embodiment of the present invention is a multilayered transmission line plate which includes a pair of ground layers 12 and 22; a differential wiring 92 disposed between the one-sided ground layer 12 of the pair of the ground layers 12 and 22 and the other ground layer 22; an insulating layer (2-I) 41 disposed between the differential wiring 92 and the one-sided ground layer 12; and an insulating layer (2-II) 42 disposed between the differential wiring 92 and the other ground layer 22, and in which the insulating layer (2-II) 42 has an insulating layer (2-IIA) 42a and an insulating layer (2-IIB) 42b laminated on the insulating layer (2-IIA) 42a; the insulating layer (2-I) 41 contains a glass cloth and a resin; the insulating layer (2-IIA) 42a contains a resin and does not contain a glass cloth; the insulating layer (2-IIB) 42b contains a glass cloth and a resin; and the thickness of the insulating layer (2-II) 42 is equal to or less than the thickness of the insulating layer (2-I) 41.

Although FIG. 4 shows an example in which the insulating layer (2-IIB) 42b is disposed between the differential wiring 92 and the insulating layer (2-IIA) 42a, an embodiment in which the insulating layer (2-IIA) 42a is disposed between the differential wiring 92 and the insulating layer (2-IIB) 42b may also be adopted.

In the multilayered transmission line plate 2A according to the second embodiment of the present invention, by changing the insulating layer 62 in the conventional multilayered transmission line plate 4A shown in FIG. 6 to the insulating layer (2-II) 42 having the insulating layer (2-IIA) 42a containing a resin and not containing a glass cloth and the insulating layer (2-IIB) 42b containing a glass cloth and a resin, it is able to contemplate to reduce the heterogeneity of the dielectric constant and to reduce the skew without impairing the handling properties.

At this time, for the same reason as mentioned above, it is important that the thickness of the insulating layer (2-II) 42 including the insulating layer (2-IIA) 42a is equal to the thickness of the insulating layer (2-I) 41 containing a glass cloth and a resin or thinner than the thickness of the insulating layer (2-I) 41.

Although the thickness of the insulating layer (2-I) 41 is not particularly limited, it is, for example, 40 to 400 µm, and from the viewpoint of making both thinning and loss reduction compatible with each other, the thickness of the insulating layer (2-I) 41 can be set to 50 to 300 µm, and from the same viewpoint, it can also be set to 60 to 200 µm.

Although the thickness of the insulating layer (2-II) 42 is not particularly limited, it is, for example, 40 to 400 µm, and from the viewpoint of making both thinning and loss reduction compatible with each other, the thickness of the insulating layer (2-II) 42 can be set to 60 to 300 µm, and from the same viewpoint, it can also be set to 80 to 200 µm.

Although the thickness of the insulating layer (2-IIA) 42a is not particularly limited, it is, for example, 10 to 300 µm, and from the viewpoint of making both thinning and loss reduction compatible with each other, the thickness of the insulating layer (2-IIA) 42a can be set to 20 to 260 µm, and from the same viewpoint, it can also be set to 30 to 150 µm.

Although the thickness of the insulating layer (2-IIB) 42b is not particularly limited, it is, for example, 30 to 390 µm, and from the viewpoint of making both thinning and loss reduction compatible with each other, the thickness of the insulating layer (2-IIB) 42b can be set to 40 to 280 µm, and from the same viewpoint, it can also be set to 50 to 170 µm.

Although a ratio of the thickness of the insulating layer (2-IIA) 42a to the thickness of the insulating layer (2-IIB) 42b [{insulating layer (2-IIA)}/{insulating layer (2-IIB)}] is not particularly limited, it is, for example, 0.1 to 3.0, and from the viewpoint of making both thinning and loss reduction compatible with each other, the ratio can be set to 0.3 to 2.0, and from the same viewpoint, it can also be set to 0.5 to 1.8.

The thickness of the insulating layer (2-I) 41 is equal to or less than the thickness of the insulating layer (2-II) 42, and from the viewpoint of making both thinning and loss reduction compatible with each other, the thickness of the insulating layer (2-I) 41 can be set to less than the thickness of the insulating layer (2-II) 42.

In addition, from the same viewpoint, a difference between the thickness of the insulating layer (2-I) 41 and the thickness of the insulating layer (2-II) 42 can be set to 0 to 150 µm and can also be set to 0.01 to 100 µm.

Production Method of Multilayered Transmission Line Plate According to the Second Embodiment Next, the production method of the multilayered transmission line plate 2A according to the second embodiment of the present invention is described.

The multilayered transmission line plate 2A according to the second embodiment of the present invention can be, for example, produced by a method in which a copper foil on a one-sided surface of a laminated plate obtained by laminating a copper foil on both surfaces of a prepreg and then curing is subjected to circuit processing, and the copper foil on the other surface is removed, thereby forming the insulating layer (2-IIB) 42b in which the differential wiring 92 is disposed on a one-sided surface thereof subsequently, a prepreg for forming the insulating layer (2-I) 41 and a copper foil constituting the ground layer 12 are laminated in this order on the surface on which the differential wiring 92 is formed; and a resin film for forming the insulating layer (2-IIA) 42a and a copper foil constituting the ground layer 22 are laminated in this order on the surface of the insulating layer (2-IIB) 42b on the opposite side to the differential wiring 92, followed by molding.

Multilayered Transmission Line Plate According to the Third Embodiment

Figure 5:
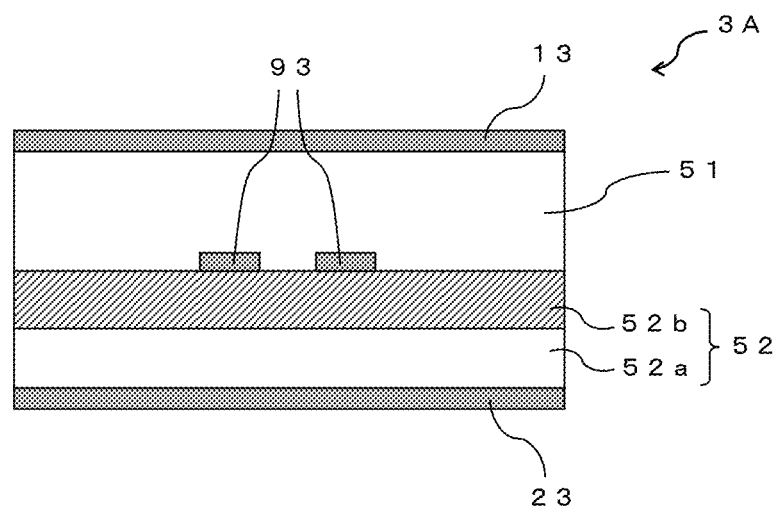
FIG. 5 is a schematic cross-sectional view showing a multilayered transmission line plate according to a third embodiment (Example 10) of the present invention.

FIG. 5 is a schematic cross-sectional view showing a multilayered transmission line plate 3A according to the third embodiment of the present invention.

As shown in FIG. 5, the multilayered transmission line plate 3A according to the third embodiment of the present invention is a multilayered transmission line plate which includes a pair of ground layers 13 and 23; a differential wiring 93 disposed between the one-sided ground layer 13 of the pair of the ground layers 13 and 23 and the other ground layer 23; an insulating layer (3-I) 51 disposed between the differential wiring 93 and the one-sided ground layer 13; and an insulating layer (3-II) 52 disposed between the differential wiring 93 and the other ground layer 23, and in which the insulating layer (3-II) 52 has an insulating layer (3-IIA) 52a and an insulating layer (3-IIB) 52b laminated on the insulating layer (3-IIA) 52a; the insulating layer (3-I) 51 is a layer containing a resin and not containing a glass cloth;

the insulating layer (3-IIA) 52*a* is a layer containing a resin and not containing a glass cloth; and the insulating layer (3-IIB) 52*b* is a layer containing a glass cloth and a resin.

Although FIG. 5 shows an example in which the insulating layer (3-IIB) 52*b* is disposed between the differential wiring 93 and the insulating layer (3-IIA) 52*a*, the insulating layer (3-IIA) 52*a* may also be disposed between the differential wiring 93 and the insulating layer (3-IIB) 52*b*.

In the multilayered transmission line plate 3A according to the third embodiment of the present invention, by changing the insulating layer 62 in the conventional multilayered transmission line plate 4A shown in FIG. 6 to the insulating layer (3-II) 52 having the insulating layer (3-IIA) 52*a* that is the layer containing a resin and not containing a glass cloth and the insulating layer (3-IIB) 52*b* that is the layer containing a glass cloth and a resin as well as changing the insulating layer 61 to the insulating layer (3-I) 51 that is the layer containing a resin and not containing a glass cloth, it is able to contemplate to reduce the skew without impairing the handling properties.

In the multilayered transmission line plate 3A according to the third embodiment of the present invention, since the insulating layer not containing a glass cloth interposes between the differential wiring 93 and the one-sided ground layer 13 as well as between the differential wiring 93 and the other ground layer 23, an effect for reducing the skew is obtained regardless of the thicknesses of the insulating layer (3-I) 51 and the insulating layer (3-II) 52.

Although the thickness of the insulating layer (3-I) 51 is not particularly limited, it is, for example, 10 to 300 μm, and from the viewpoint of making both thinning and loss reduction compatible with each other, the thickness of the insulating layer (3-I) 51 can be set to 20 to 250 μm, and from the same viewpoint, it can also be set to 30 to 200 μm.

Although the thickness of the insulating layer (3-II) 52 is not particularly limited, it is, for example, 40 to 300 μm, and from the viewpoint of making both thinning and loss reduction compatible with each other, the thickness of the insulating layer (3-II) 52 can be set to 60 to 250 μm, and from the same viewpoint, it can also be set to 80 to 200 μm.

Although the thickness of the insulating layer (3-IIA) 52*a* is not particularly limited, it is, for example, 10 to 270 μm, and from the viewpoint of making both thinning and loss reduction compatible with each other, the thickness of the insulating layer (3-IIA) 52*a* can be set to 20 to 210 μm, and from the same viewpoint, it can also be set to 30 to 150 μm.

Although the thickness of the insulating layer (3-IIB) 52*b* is not particularly limited, it is, for example, 30 to 290 μm, and from the viewpoint of making both thinning and loss reduction compatible with each other, the thickness of the insulating layer (3-IIB) 52*b* can be set to 40 to 230 μm, and from the same viewpoint, it can also be set to 50 to 170 μm.

Although a ratio of the thickness of the insulating layer (3-IIA) 52*a* to the thickness of the insulating layer (3-IIB) 52*b* [{insulating layer (3-IIA)}/{insulating layer (3-IIB)}] is not particularly limited, from the viewpoint of making both thinning and loss reduction compatible with each other, the ratio can be set to 0.2 to 3.0, and from the same viewpoint, it can be set to 0.3 to 2.0 and it can also be set to 0.5 to 1.5.

Production Method of Multilayered Transmission Line Plate According to the Third Embodiment Next, the production method of the multilayered transmission line plate 3A according to the third embodiment of the present invention is described.

The multilayered transmission line plate 3A according to the third embodiment of the present invention can be, for example, produced by a method in which a copper foil on a one-sided surface of a laminated plate obtained by laminating a copper foil on both surfaces of a prepreg and then curing is subjected to circuit processing, and the copper foil on the other surface is removed, thereby forming the insulating layer (3-IIB) 52*b* in which the differential wiring 93 is disposed on a one-sided surface thereof subsequently, a resin film for forming the insulating layer (3-I) 51 and a copper constituting the ground layer 13 are laminated in this order on the surface on which the differential wiring 93 is formed; and a resin film for forming the insulating layer (3-IIA) 52*a* and a copper foil constituting the ground layer 23 are laminated in this order on the surface of the insulating layer (3-IIB) 52*b* on the opposite side to the differential wiring 93, followed by molding.

Even in all of the multilayered transmission line plates of the first, second, and third embodiments of the present invention, when a low-loss material is used, the transmission loss is reduced, and the signal quality can be much more improved.

While the preferred embodiments of the present invention have been described, it should be construed that the present invention is not limited to the aforementioned embodiments. The present invention can be modified within a range where a gist thereof is not deviated.

The multilayered transmission line plate of the present invention is suitably used for electronic appliances dealing with high-frequency signals of 1 GHz or more, and in particular, is suitably used for electronic appliances dealing with high-frequency signals of 10 GHz or more, or high-frequency signals of 30 GHz or more.

EXAMPLES

The present invention is hereunder described in more detail based on the following Examples, but it should be construed that the present invention is by no means limited by the following Examples.

Synthesis Example 1

Production of Polyphenylene Ether Derivative (A)

A polyphenylene ether derivative (A) having at least one N-substituted maleimide group in a molecule thereof was produced according to the following procedures.

In a glass-made flask having a capacity of 2 liters and equipped with a thermometer, a reflux condenser, and a stirring device, which is capable of being heated and cooled, 190 parts by mass of toluene, 100 parts by mass of PP0640 (polyphenylene ether, number average molecular weight: about 16,000, manufactured by SABIC Innovative Plastics), and 1.35 parts by mass of p-aminophenol were charged and dissolved with stirring while setting a temperature within the flask at 90° C. and keeping the temperature. After confirming the dissolution through visual inspection, 2 parts by mass of PERBUTYL-I (t-butyl peroxy isopropyl monocarbonate, manufactured by NOF Corporation) and 0.15 parts by mass of manganese naphthenate were added, and the contents were allowed to react with each other at a solution temperature of 90° C. for 4 hours and then cooled to 70° C., thereby obtaining a polyphenylene ether compound (A') having a primary amino group at a molecular end thereof.

Subsequently, to the aforementioned reaction solution, 7.2 parts by mass of 2,2-bis(4-(4-maleimidophenoxy)phenyl)

propane (a trade name: "BMI-4000", manufactured by Daiwakasei Industry Co., Ltd.) and 190 parts by mass of propylene glycol monomethyl ether were added; the liquid temperature was raised while stirring; the contents were allowed to react with each other for 4 hours while keeping the temperature at 120° C.; and the resultant was cooled and subjected to 200-mesh filtration, thereby producing a polyphenylene ether derivative (A).

Synthesis Example 2

Production of Polyaminobismaleimide Compound (B)

In a glass-made flask having a capacity of 1 liter and equipped with a thermometer, a reflux condenser, and a stirring device, which is capable of being heated and cooled, 50 parts by mass of 2,2-bis(4-(4-maleimidophenoxy)phenyl)propane, 50 parts by mass of 3,3'-dimethyl-5,5'-diethyl-4,4'-diphenylmethane bismaleimide (a trade name: "BMI-5100", manufactured by Daiwakasei Industry Co., Ltd.), 14 parts by mass of 4,4'-[1,3-phenylenebis(1-methylethylidene)]bisaniline (a trade name: "BISANILINE M", manufactured by Mitsui Chemicals, Inc.), and 50 parts by mass of propylene glycol monomethyl ether were charged; the contents were allowed to react with each other with stirring for 3 hours while keeping the liquid temperature at 120° C.; and the resultant was cooled and subjected to 200-mesh filtration, thereby producing a polyaminobismaleimide compound (B).

Production Example 1

Preparation of Thermosetting Resin Composition (Resin Varnish) 1

100 parts by mass of the polyphenylene ether derivative (A) and 450 parts by mass of the polyaminobismaleimide compound (B) as obtained above as well as 870 parts by mass of an inorganic filler AlOOH (a boehmite-type aluminum hydroxide, density: 3.0 g/cm$^3$, manufactured by Kawai Lime Industry Co., Ltd.), 7 parts by mass of a curing accelerator PERBUTYL-P ($\alpha,\alpha'$-bis(t-butylperoxy)diisopropylbenzene, manufactured by NOF Corporation), 7 parts by mass of G-8009L (an isocyanate-masked imidazole, manufactured by Dai-ichi Kogyo Seiyaku Co., Ltd.), and 800 parts by mass of methyl ethyl ketone were used and stirred and mixed while heating at 60° C., thereby preparing a thermosetting resin composition (resin varnish) 1 having a solid matter (non-volatile matter) concentration of about 55% by mass.

Production Example 2

Preparation of Thermosetting Resin Composition (Resin Varnish) 2

A thermosetting resin composition (resin varnish) 2 having a solid matter (non-volatile matter) concentration of about 55% by mass was prepared in the same manner as in Production Example 1, except for using 640 parts by mass of the inorganic filler AlOOH and 620 parts by mass of the methyl ethyl ketone.

Production Example 3

Preparation of Thermosetting Resin Composition (Resin Varnish) 3

A thermosetting resin composition (resin varnish) 3 having a solid matter (non-volatile matter) concentration of about 55% by mass was prepared in the same manner as in Production Example 1, except for using 460 parts by mass of the inorganic filler AlOOH and 470 parts by mass of the methyl ethyl ketone.

Production Example 4

Fabrication of Copper-Cladded Laminated Plate 1

The aforementioned thermosetting resin composition (resin varnish) 1 was coated on a glass cloth having a thickness of 0.1 mm (an NE-glass, manufactured by Nitto Boseki Co., Ltd., dielectric constant: 4.4) and then heated for drying at 160° C. for 7 minutes, thereby fabricating a prepreg having a resin content (resin matter) of about 54% by mass. A low-profile copper foil having a thickness of 18 lam (FV-WS, M-plane Rz: 1.5 μm, manufactured by Furukawa Electric Co., Ltd.) was disposed on the top and bottom of the prepreg such that the M-plane came into contact therewith, and heating and pressurization were performed under a condition at a temperature of 230° C. and a pressure of 3.9 MPa for a time of 180 minutes, thereby fabricating a copper-cladded laminated plate 1 (thickness: 130 μm). A dielectric constant of a resin plate fabricated by heating and curing this resin varnish was measured under a condition at a temperature of 230° C. for a time of 180 minutes by the cavity perturbation method (cavity resonator: CP531, manufactured by Kanto Electronic Application and Development Inc.) in a 10 GHz band, and as a result, it was found to be 4.4 (10 GHz). That is, a difference in dielectric constant between the glass cloth and the resin composition, each being included in the copper-cladded laminated plate 1, was 0.

Production Example 5

Fabrication of Copper-Cladded Laminated Plate 2

A copper-cladded laminated plate 2 (thickness: 130 μm) was fabricated in the same manner as in Production Example 4, except for using the aforementioned thermosetting resin composition (resin varnish) 2 for the thermosetting resin composition (resin varnish). A dielectric constant of a resin plate fabricated from this resin varnish under the same condition as in Production Example 4 was measured under the same condition as in Production Example 4, and as a result, it was found to be 4.0 (10 GHz). That is, a difference in dielectric constant between the glass cloth and the resin composition, each being included in the copper-cladded laminated plate 2, was 0.4.

Production Example 6

Fabrication of Copper-Cladded Laminated Plate 3

A copper-cladded laminated plate 3 (thickness: 130 μm) was fabricated in the same manner as in Production Example 4, except for using the aforementioned thermosetting resin composition (resin varnish) 3 for the thermosetting resin composition (resin varnish). A dielectric constant of a resin plate fabricated from this resin varnish under the same condition as in Production Example 4 was measured under the same condition as in Production Example 4, and as a result, it was found to be 3.6 (10 GHz). That is, a difference in dielectric constant between the glass cloth and the resin composition, each being included in the copper-cladded laminated plate 3, was 0.8.

Example 1

Fabrication of Multilayered Transmission Line Plate 1A

The multilayered transmission line plate 1A shown in FIG. 3 was fabricated according to the following procedures.

First of all, a laminated plate in which a copper foil was formed on the both surfaces of the insulating layer (1-II) 32 (a trade name: LW-900G, manufactured by Hitachi Chemical Company, Ltd.) was prepared. The thickness of the insulating layer (1-II) 32 of this laminated plate is 130 µm, the thickness of the copper foil is 18 µm, and the conductor surface roughness (Rz) on the side of the insulating layer (1-II) 32 is 3.0 µm.

Subsequently, the copper foil on one surface of the aforementioned laminated plate was subjected to patterning by means of etching, thereby forming an inner layer circuit board P. That is, the inner layer circuit board P indicates one in which the differential wiring 91 is disposed on a one-sided surface of the insulating layer (1-II) 32, and the ground layer 21 is disposed on the other surface.

Subsequently, the resin film for forming the insulating layer (1-I) 31 was fabricated according to the following procedures.

48 parts by mass (solid content) of 2,2-bis(4-cyanatophenyl)propane (a trade name: BADCY, manufactured by Lonza), 4 parts by mass (solid content) of p-(α-cumyl)phenol (manufactured by Tokyo Chemical Industry Co., Ltd.), and 0.008 parts by mass (solid content) of manganese naphthenate (manufactured by Wako Pure Chemical Industries, Ltd.) were dissolved in 21 mL of toluene and allowed to react with each other under heating at 110° C. for 3 hours.

Thereafter, the temperature was set to 80° C., and this solution was blended with 48 parts by mass (solid content) of a hydrogenated product of a styrene-butadiene copolymer (a trade name: TUFTEC H1051, manufactured by Asahi Chemicals Co., Ltd., styrene content ratio: 42%, number average molecular weight Mn: 66,000), 80 mL of toluene, and 25 mL of methyl ethyl ketone while stirring. The blend was then cooled to room temperature. Then, the resultant was blended with 0.02 parts by mass (solid content) of zinc naphthenate (manufactured by Wako Pure Chemical Industries, Ltd.) to prepare a varnish, from which was then fabricated a semi-cured resin film having a thickness of 65 µm.

Subsequently, two sheets of the fabricated resin film were superimposed on the surface of the inner layer circuit board P on the side of the differential wiring 91 and temporarily pressure bonded under a condition at a temperature 120° C. and a pressure of 0.5 MPa for a time of 40 seconds. Furthermore, a copper foil having a thickness 18 µm, which constitutes the ground layer 11 (a trade name: 3EC-VLP-18, manufactured by Mitsui Mining and Smelting Co., Ltd., surface roughness Rz of the roughed surface: 3.0 µm), was superimposed on the surface of the resin film on the opposite side to the differential wiring 91 and laminated under a condition at a temperature of 230° C. and a pressure 3.0 MPa for a time of 80 minutes, thereby obtaining a multilayered transmission line plate before interlayer connection.

Subsequently, the ground layers 11 and 21 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 1A.

Example 2

Fabrication of Multilayered Transmission Line Plate 1B

The multilayered transmission line plate 1B was fabricated in the same procedures as in Example 1, except that in Example 1, the thickness of the resin film was changed to 80 µm, and the number of sheet of the resin film to be superimposed on the surface of the inner layer circuit board P on the side of the differential wiring 91 was changed to one.

Example 3

Fabrication of Multilayered Transmission Line Plate 1C

The multilayered transmission line plate 1C was fabricated in the same procedures as in Example 1, except that in Example 1, the thickness of the resin film was changed to 50 µm, and the number of sheet of the resin film to be superimposed on the surface of the inner layer circuit board P on the side of the differential wiring 91 was changed to one.

Subsequently, the multilayered transmission line plate shown in FIG. 3 was fabricated using each of the copper-cladded laminated plates 1 to 3 obtained in the respective Production Examples.

Example 4

Fabrication of Multilayered Transmission Line Plate 1D

First of all, the copper foil on one surface of the aforementioned copper-cladded laminated plate 1 was subjected to patterning by means of etching, thereby forming an inner layer circuit board Q. That is, the inner layer circuit board Q indicates one in which the differential wiring 91 is disposed on a one-sided surface of the insulating layer (1-II) 32, and the ground layer 21 is disposed on the other surface.

Subsequently, a multilayered transmission line plate 1D was fabricated by using the resin film fabricated in Example 1 and the aforementioned inner layer circuit board Q and going through the same steps as in Example 1.

Example 5

Fabrication of Multilayered Transmission Line Plate 1E

A multilayered transmission line plate 1E was fabricated in the same manner as in Example 4, except that in Example 4, the copper-cladded laminated plate 1 was replaced by the copper-cladded laminated plate 2.

Example 6

Fabrication of Multilayered Transmission Line Plate 1F

A multilayered transmission line plate 1F was fabricated in the same manner as in Example 4, except that in Example 4, the copper-cladded laminated plate 1 was replaced by the copper-cladded laminated plate 3.

Example 7

Fabrication of Multilayered Transmission Line Plate 2A

The multilayered transmission line plate 2A shown in FIG. 4 was fabricated according to the following procedures.

First of all, a laminated plate in which a copper foil was formed on the both surfaces of the insulating layer (2-IIB) 42b (a trade name: LW-900G, manufactured by Hitachi Chemical Company, Ltd.) was prepared. The thickness of the insulating layer (2-IIB) 42b of this laminated plate is 80 μm, the thickness of the copper foil is 18 μm, and the conductor surface roughness (Rz) on the side of the insulating layer (2-IIB) 42b is 3.0 μm.

Subsequently, the copper foil on a one-sided surface of the aforementioned laminated plate was subjected to patterning by means of etching, and the copper foil on the other surface was removed by means of etching, thereby forming an inner layer circuit board R. That is, the inner layer circuit board R indicates one in which the differential wiring 92 is disposed on a one-sided surface of the insulating layer (2-IIB) 42b.

Subsequently, a semi-cured resin film having a thickness of 50 μm was fabricated according to the same procedures as in Example 1.

Subsequently, one sheet of the aforementioned resin film was superimposed on the surface of the inner layer circuit board R from which the copper foil had been removed and temporarily pressure bonded under a condition at a temperature 120° C. and a pressure of 0.5 MPa for a time of 40 seconds. Subsequently, a prepreg having a thickness of 130 μm (a trade name: GWA-900G, manufactured by Hitachi Chemical Company, Ltd.) was superimposed on the surface of the inner layer circuit board P on the side of the differential wiring 92; and furthermore, a copper foil having a thickness 18 μm, which constitutes each of the ground layers 22 and 12 (a trade name: 3EC-VLP-18, manufactured by Mitsui Mining and Smelting Co., Ltd., surface roughness Rz of the roughed surface: 3.0 lam), was superimposed on the surface of the resin film on the opposite side to the inner layer circuit board R and the surface of the prepreg on the opposite side to the differential wiring 92, respectively and laminated under a condition at a temperature of 230° C. and a pressure 3.0 MPa for a time of 80 minutes, thereby fabricating a multilayered transmission line plate before interlayer connection.

Subsequently, the ground layers 12 and 22 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 2A.

Example 8

Fabrication of Multilayered Transmission Line Plate 2B

A multilayered transmission line plate 2B was fabricated in the same manner as in Example 7, except that in Example 7, the thickness of the insulating layer (2-IIB) 42b was changed to 50 μm, and the thickness of the resin film was changed to 80 μm.

Example 9

Fabrication of Multilayered Transmission Line Plate 2C

A multilayered transmission line plate 2C was fabricated in the same manner as in Example 7, except that in Example 7, the thickness of the insulating layer (2-IIB) 42b was changed to 50 μm.

Example 10

Fabrication of Multilayered Transmission Line Plate 3A

The multilayered transmission line plate 3A shown in FIG. 5 was fabricated according to the following procedures.

First of all, a laminated plate in which a copper foil was formed on the both surfaces of the insulating layer (3-IIB) 52b (a trade name: LW-900G, manufactured by Hitachi Chemical Company, Ltd.) was prepared. The thickness of the insulating layer (3-IIB) 52b is 80 μm, the thickness of the copper foil is 18 μm, and the conductor surface roughness (Rz) on the side of the insulating layer (3-IIB) 52b is 3.0 μm.

Subsequently, the copper foil on a one-sided surface of the aforementioned laminated plate was subjected to patterning by means of etching, and the copper foil on the other surface was removed by means of etching, thereby forming an inner layer circuit board S. That is, the inner layer circuit board S indicates one in which the differential wiring 93 is disposed on a one-sided surface of the insulating layer (3-IIB) 52b.

Subsequently, semi-cured resin films having a thickness of 50 μm and 65 μm, respectively were fabricated according to the same procedures as in Example 1.

Subsequently, one sheet of the 50 μm-thick resin film was superimposed on the surface of the inner layer circuit board S from which the copper foil had been removed; two sheets of the 65 μm-thick resin film were superimposed on the surface of the inner layer circuit board S on the side of the differential wiring 93; and these sheets were temporarily pressure bonded, respectively under a condition at a temperature of 120° C. and a pressure of 0.5 MPa for a time of 40 seconds. Furthermore, a copper foil having a thickness 18 μm, which constitutes each of the ground layers 23 and 13 (a trade name: 3EC-VLP-18, manufactured by Mitsui Mining and Smelting Co., Ltd., surface roughness Rz of the roughed surface: 3.0 μm), was superimposed on the surface of the 50 μm-thick resin film on the opposite side to the inner layer circuit board S and the surface of the 65 μm-thick resin film on the opposite side to the differential wiring 93, respectively and laminated under a condition at a temperature of 230° C. and a pressure 3.0 MPa for a time of 80 minutes, thereby fabricating a multilayered transmission line plate before interlayer connection.

Subsequently, the ground layers 13 and 23 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 3A.

Example 11

Fabrication of Multilayered Transmission Line Plate 3B

A multilayered transmission line plate 3B was fabricated in the same manner as in Example 10, except that in Example 10, the thickness of the resin film temporarily pressure bonded on the surface of the inner layer circuit board S from which the copper foil had been removed was changed to 80 μm.

Example 12

Fabrication of Multilayered Transmission Line Plate 3C

A multilayered transmission line plate 3C was fabricated in the same manner as in Example 10, except that in Example 10, the thickness of the insulating layer (3-IIB) 52b was changed to 50 μm.

Comparative Example 1

Fabrication of Multilayered Transmission Line Plate 4A

The multilayered transmission line plate 4A shown in FIG. 6 was fabricated according to the following procedures.

First of all, a laminated plate in which a copper foil was formed on the both surfaces of the insulating layer 62 (a trade name: LW-900G, manufactured by Hitachi Chemical Company, Ltd.) was prepared. The thickness of the insulating layer 62 is 130 μm, the thickness of the copper foil is 18 μm, and the conductor surface roughness (Rz) on the side of the insulating layer 62 is 3.0 μm.

Subsequently, the copper foil on one surface of the aforementioned laminated plate was subjected to patterning by means of etching, thereby forming an inner layer circuit board T. That is, the inner layer circuit board T indicates one in which the differential wiring 94 is disposed on a one-sided surface of the insulating layer 62, and the ground layer 24 is disposed on the other surface.

Subsequently, a prepreg having a thickness of 130 μm (a trade name: GWA-900G, manufactured by Hitachi Chemical Company, Ltd.) was superimposed on the surface of the inner layer circuit board T on the side of the differential wiring 94; and furthermore, a copper foil having a thickness 18 μm, which constitutes the ground layer 14 (a trade name: 3EC-VLP-18, manufactured by Mitsui Mining and Smelting Co., Ltd., surface roughness Rz of the roughed surface: 3.0 μm), was superimposed on the surface of the prepreg on the opposite side to the differential wiring 94 and laminated under a condition at a temperature of 230° C. and a pressure 3.0 MPa for a time of 80 minutes, thereby fabricating a multilayered transmission line plate before interlayer connection.

Subsequently, the ground layers 14 and 24 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 4A.

Comparative Example 2

Fabrication of Multilayered Transmission Line Plate 5A

Figure 7:
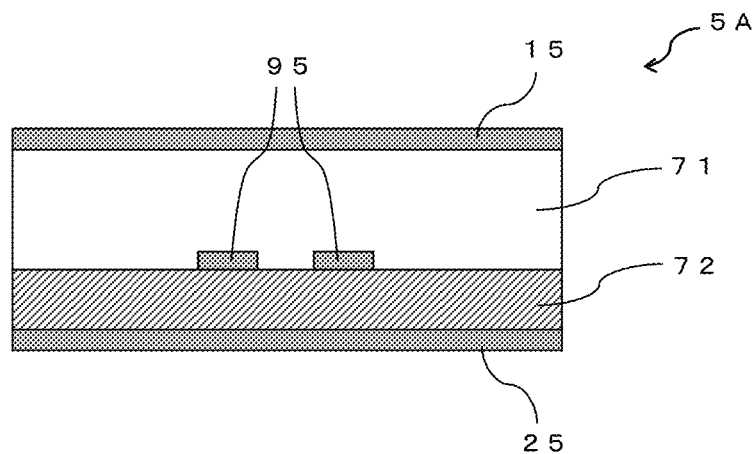
FIG. 7 is a schematic cross-sectional view showing a multilayered transmission line plate produced in Comparative Example 2 of the present invention.
Figure 8:
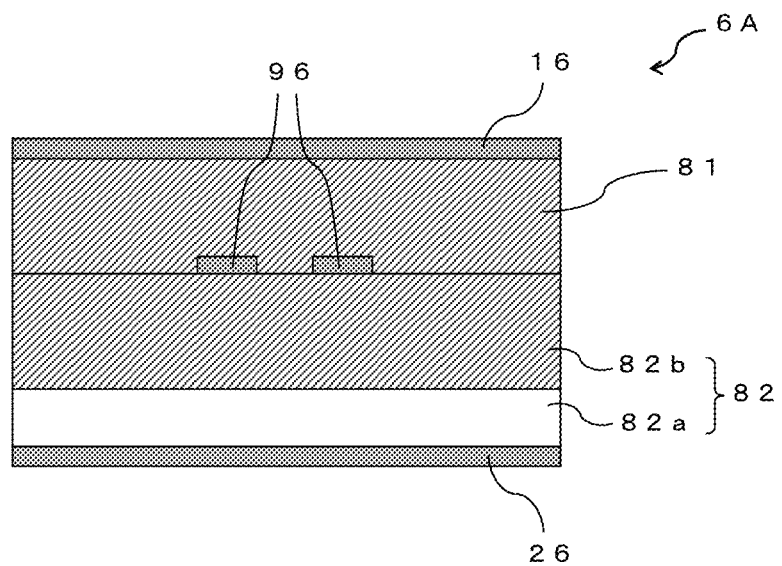
FIG. 8 is a schematic cross-sectional view showing a multilayered transmission line plate produced in Comparative Example 3 of the present invention.

The multilayered transmission line plate 5A shown in FIG. 7 was fabricated according to the following procedures.

A multilayered transmission line plate 5A was fabricated in the same manner as in Example 1, except that in Example 1, the thickness of the insulating layer (1-II) 32 was changed to 50 μm.

Comparative Example 3

Fabrication of Multilayered Transmission Line Plate 6A

A multilayered transmission line plate 6A was fabricated in the same manner as in Example 7, except that in Example 7, the thickness of the insulating layer (2-IIB) 42b was changed to 130 μm.

Measuring Method of Skew

The skew of each of the above-obtained multilayered transmission line plates was measured by the following method.

A high-frequency signal of 10 GHz was entered into the differential wiring from a network analyzer (a trade name: N5227A, manufactured by Keysight Technologies) connected via a coaxial cable (a trade name: SUCOFLEX 104, manufactured by Huber+Suhner), and a delay time when the signal propagated through the wiring was measured. The skew was calculated from a difference in delay time between the wirings.

When defining the skew of the multilayered transmission line plate of Comparative Example 1 having a conventional structure as 100%, respective proportions (%) relative to the skew of Comparative Example 1 are shown in Tables 1 to 3. It is indicated that the smaller the numerical value, the higher the effect for reducing the skew is.

TABLE 1

| | Example 1 | Example 2 | Example 3 | Example 4 | Example 5 | Example 6 | Comparative Example 1 | Comparative Example 2 |
|---|---|---|---|---|---|---|---|---|
| Multilayered transmission line plate | 1A | 1B | 1C | 1D | 1E | 1F | 4A | 5A |
| Thickness of insulating layer (1-I) (μm) | 130 | 80 | 50 | 130 | 130 | 130 | (130) *1 | 130 |

TABLE 1-continued

|  | Example 1 | Example 2 | Example 3 | Example 4 | Example 5 | Example 6 | Comparative Example 1 | Comparative Example 2 |
|---|---|---|---|---|---|---|---|---|
| Thickness of insulating layer (1-II) (μm) | 130 | 130 | 130 | 130 | 130 | 130 | (130) *1 | 50 |
| Skew (%) | 6 | 6 | 4 | 1 | 5 | 8 | 100 | 39 |

*1: Thickness of each of the insulating layers 61 and 62 in the multilayered transmission line plate 4A

TABLE 2

|  | Example 7 | Example 8 | Example 9 | Comparative Example 1 | Comparative Example 3 |
|---|---|---|---|---|---|
| Multilayered transmission line plate | 2A | 2B | 2C | 4A | 6A |
| Thickness of insulating layer (2-I) (μm) | 130 | 130 | 130 | (130) *1 | 130 |
| Thickness of insulating layer (2-II) (μm) | 130 | 130 | 100 | (130) *1 | 180 |
| Thickness of insulating layer (2-IIB) (μm) | 80 | 50 | 50 | — | 130 |
| Thickness of insulating layer (2-IIA) (μm) | 50 | 80 | 50 | — | 50 |
| Skew (%) | 22 | 13 | 14 | 100 | 95 |

*1: Thickness of each of the insulating layers 61 and 62 in the multilayered transmission line plate 4A

TABLE 3

|  | Example 10 | Example 11 | Example 12 | Comparative Example 1 |
|---|---|---|---|---|
| Multilayered transmission line plate | 3A | 3B | 3C | 4A |
| Thickness of insulating layer (3-I) (μm) | 130 | 130 | 130 | (130) *1 |
| Thickness of insulating layer (3-II) (μm) | 130 | 160 | 100 | (130) *1 |
| Thickness of insulating layer (3-IIB) (μm) | 80 | 80 | 50 | — |
| Thickness of insulating layer (3-IIA) (μm) | 50 | 80 | 50 | — |
| Skew (%) | 7 | 3 | 5 | 100 |

*1: Thickness of each of the insulating layers 61 and 62 in the multilayered transmission line plate 4A Examples 1 to 6 are concerned with an example in which in the multilayered transmission line plate 4A of Comparative Example 1 having a conventional structure, a part of the insulating layers containing a glass cloth and a resin is changed to an insulating layer containing a resin and not containing a glass cloth. Although Examples 1 to 6 are each different in the thickness of the insulating layer, in all of these Examples 1 to 6, the skew is significantly reduced to 1 to 8%. It may be considered that this was caused due to the matter that by substituting the material, the heterogeneity of the dielectric constant is greatly improved.

Comparative Example 2 is concerned with an example in which in the multilayered transmission line plate 1A of Example 1, the thickness of the insulating layer (1-II) 32 is thinner than the thickness of the insulating layer (1-I) 31. In Comparative Example 2, the skew is 39%, and the effect for reducing the skew is low as compared with that in Example 1.

It may be considered that this was caused due to the matter that in the multilayered transmission line plate 5A of Comparative Example 2, an electric field formed between the differential wiring 95 and the ground layers 15 and 25 becomes stronger on the side of the insulating layer 72 at which the distance between the differential wiring 95 and the ground layer is short, and therefore, the influence of the material including a glass cloth is more strongly received. That is, it may be considered that the influence of the heterogeneity of the dielectric constant is more likely received, and as a result, the effect for reducing the skew is lowered.

Examples 7 to 9 are concerned with an example in which in the multilayered transmission line plate 4A of Comparative Example 1 having a conventional structure, a part of the insulating layer 62 containing a glass cloth and a resin is changed to the insulating layer (2-IIA) 42a that is a layer containing a resin and not containing a glass cloth. In all of Examples 7 to 9, the skew is reduced to 13 to 22%. It may be considered that this was caused due to the matter that by substituting the material, the heterogeneity of the dielectric constant is greatly improved.

Comparative Example 3 is concerned with an example in which in the multilayered transmission line plates of Examples 7 to 9, the thickness of the insulating layer (2-IIB) 42b is made thick.

It may be considered that as in the multilayered transmission line plate 6A of Comparative Example 3, even in the case where the insulating layer 82a that is a layer containing a resin and not containing a glass cloth is laminated, when the thickness of the insulating layer 82 including the insulating layer 82a containing a resin and not containing a glass cloth is thicker than the thickness of the insulating layer 81, similar to Comparative Example 2, the influence of the material including a glass cloth, namely the influence of the layer in which the dielectric constant is heterogeneous is more likely received, and as a result, the effect for reducing the skew is lowered.

Examples 10 to 12 are concerned with an example in which in the multilayered transmission line plate 4A of Comparative Example 1 having a conventional structure, a part of the insulating layer 62 that is a layer containing a glass cloth and a resin is changed to the insulating layer (3-IIA) 52a that is a layer containing a resin and not containing glass cloth. In all of Examples 10 to 12, the skew is significantly reduced to less than 10%. It may be considered that this was caused due to the matter that by substituting the material, the heterogeneity of the dielectric constant is greatly improved.

It is noted from the aforementioned measurement results that the multilayered transmission line plate of the present invention is able to reduce a skew in the differential transmission without adopting a complicated process. Furthermore, all of these structures have an insulating layer including a glass cloth, and the aforementioned effects can be obtained without impairing the handling properties.

REFERENCE SIGNS LIST 1A to 6A: Multilayered transmission line plate
11 to 16, 21 to 26: Ground layer
31: Insulating layer (1-I)
32: Insulating layer (1-II)
41: Insulating layer (2-I)
42: Insulating layer (2-II)
42a: Insulating layer (2-IIA)
42b: Insulating layer (2-IIB)
51: Insulating layer (3-I)
52: Insulating layer (3-II)
52a: Insulating layer (3-IIA)
52b: Insulating layer (3-IIB)
61, 62, 72, 81, 82b: Insulating layer containing a glass cloth and a resin
71, 82a: Insulating layer containing a resin and not containing a glass cloth
91 to 96: Differential wiring

The invention claimed is:

1. A multilayered transmission line plate comprising:
a pair of ground layers,
a differential wiring disposed between a one-sided ground layer of the pair of ground layers and the other ground layer,
an insulating layer (X) disposed between the differential wiring and the one-sided ground layer, and
an insulating layer (Y) disposed between the differential wiring and the other ground layer,
wherein
the insulating layer (X) has a layer containing a resin and not containing a glass cloth;
the insulating layer (X) or the insulating layer (Y) has a layer containing a glass cloth and a resin; and
the thickness of the insulating layer (X) is equal to or less than the thickness of the insulating layer (Y).

2. The multilayered transmission line plate according to claim 1, comprising:
a pair of ground layers,
a differential wiring disposed between a one-sided ground layer of the pair of ground layers and the other ground layer,
an insulating layer (1-I), as the insulating layer (X), between the differential wiring and the one-sided ground layer, and
an insulating layer (1-II), as the insulating layer (Y), between the differential wiring and the other ground layer,
wherein
the insulating layer (1-I) is a layer containing a resin and not containing a glass cloth;
the insulating layer (1-II) is a layer containing a glass cloth and a resin; and
the thickness of the insulating layer (1-I) is equal to or less than the thickness of the insulating layer (1-II).

3. The multilayered transmission line plate according to claim 1, comprising:
a pair of ground layers,
a differential wiring disposed between a one-sided ground layer of the pair of ground layers and the other ground layer,
an insulating layer (2-I), as the insulating layer (Y), between the differential wiring and the one-sided ground layer, and
an insulating layer (2-II), as the insulating layer (X), between the differential wiring and the other ground layer,
wherein
the insulating layer (2-II) comprises an insulating layer (2-IIA) and an insulating layer (2-IIB) laminated on the insulating layer (2-IIA);
the insulating layer (2-I) is a layer containing a glass cloth and a resin;
the insulating layer (2-IIA) is a layer containing a resin and not containing a glass cloth;
the insulating layer (2-IIB) is a layer containing a glass cloth and a resin; and
the thickness of the insulating layer (2-II) is equal to or less than the thickness of the insulating layer (2-I).

4. The multilayered transmission line plate according to claim 1, wherein the layer containing a glass cloth and a resin is a layer containing a glass cloth and a resin composition, and a difference in dielectric constant between the glass cloth and the resin composition is 1.0 or less.

5. The multilayered transmission line plate according claim 1, wherein the dielectric constant of the glass cloth is 5.0 or less.

6. The multilayered transmission line plate according to claim 1, wherein the insulating layer (Y) has a layer containing a glass cloth and a resin.

7. The multilayered transmission line plate according to claim 1, wherein the insulating layer (Y) is a layer containing a glass cloth and a resin.

* * * * *